United States Patent
Payne et al.

(10) Patent No.: US 7,804,337 B2
(45) Date of Patent: Sep. 28, 2010

(54) METHOD AND APPARATUS OF SFDR ENHANCEMENT

(75) Inventors: Robert F. Payne, Lucas, TX (US); Marco Corsi, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 28 days.

(21) Appl. No.: 12/393,182

(22) Filed: Feb. 26, 2009

(65) Prior Publication Data

US 2009/0219060 A1    Sep. 3, 2009

(51) Int. Cl.
   *H03K 5/00*    (2006.01)
(52) U.S. Cl. .......................................... 327/91; 327/94
(58) Field of Classification Search .................. 327/91, 327/94–96
   See application file for complete search history.

(56) References Cited

U.S. PATENT DOCUMENTS

| | | | |
|---|---|---|---|
| 5,134,313 A | 7/1992 | Umeyama et al. | |
| 6,323,700 B2 | 11/2001 | Hoogzaad | |
| 6,741,105 B2* | 5/2004 | Yasukouchi et al. | 327/96 |
| 6,943,593 B2* | 9/2005 | Draxelmayr | 327/91 |
| 7,088,148 B2* | 8/2006 | Devendorf et al. | 327/94 |
| 7,248,082 B2* | 7/2007 | Nakasha et al. | 327/91 |
| 7,304,518 B2 | 12/2007 | Sanduleanu et al. | |

* cited by examiner

*Primary Examiner*—Hai L Nguyen
(74) *Attorney, Agent, or Firm*—John J. Patti; Wade J. Brady, III; Frederick J. Telecky, Jr.

(57) ABSTRACT

A track-and-hold or sample-and-hold (S/H) circuit for an analog-to-digital converter (ADC) is provided. A difference between the disclosed S/H circuit and conventional S/H circuits is the use of a peaking circuit. This peaking circuit generally provides increased current to switching transistor when transitioning between track and hold which can increase the Spurious-Free Dynamic Range (SFDR) as low frequencies, by as much as 15dB.

18 Claims, 10 Drawing Sheets

METHOD AND APPARATUS OF SFDR ENHANCEMENT

CROSS-REFERENCE TO RELATED APPLICATIONS

This application is related to U.S. patent application Ser. No. 11/876,943, entitled "Track-and-Hold Circuit with Low Distortion," filed on Oct. 23, 2007, which is hereby incorporated by reference for all purposes.

TECHNICAL FIELD

The invention relates generally to a sample-and-hold circuit and, more particularly, to a switching current source for a sample and hold circuit.

BACKGROUND

Analog-to-digital converters (ADCs) often employ track-and-hold or sample-and-hold circuits. Typically, the signals used to switch between track and hold (or sample) for conventional ADCs are in the frequency range of about 100 to 200 MHz, having very short rise and fall times (generally <50 ps). Some examples of convention sample-and-hold circuits are U.S. Pat. Nos. 6,489,814; 6,323,700; 7,304,518; 7,088,148; and 5,134,313. However, none of these conventional provide "peaking currents" for switching transistors within the sample-and-hold circuits.

SUMMARY

A preferred embodiment of the present invention, accordingly, provides a track-and-hold circuit that is adapted to track an analog input signal and hold a sampled voltage of the analog input signal at a sampling instant for processing by other circuitry, in response to a track signal that alternates with a hold signal. The track-and-hold circuit comprises a bi-directional current source that sources and sinks current through a first output node and a second output node, wherein the bi-directional current source includes: a hold terminal that is adapted to provide the hold signal; a track terminal that is adapted to provide the track signal; a first differential input circuit having a plurality of transistors, wherein the first differential input circuit is adapted to receive the track signal and the hold signal and is coupled to the first and second output nodes; a second differential input circuit having a plurality of transistors, wherein the differential input circuit is adapted to receive the track signal and the hold signal and is coupled to the first and second output nodes; and a peaking circuit that is coupled to the first and second differential input circuits, wherein the peaking circuit causes the current through at least one of the transistors to exceed a threshold for a predetermined period when the track-and-hold circuit transitions from track to hold; a unity gain amplifier that is coupled to first and second output nodes of the bi-directional current source and that receives the analog input signal; a resistor coupled to an output of the unity gain amplifier; and a capacitor coupled between the resistor and ground.

In accordance with a preferred embodiment of the present invention, the peaking circuit further comprises a second capacitor that is coupled between the hold terminal and the first differential input circuit; and a third capacitor that is coupled between the track terminal and the second differential input circuit.

In accordance with a preferred embodiment of the present invention, the peaking circuit further comprises a fourth capacitor that is coupled between the hold terminal and the second differential input circuit; and a fifth capacitor that is coupled between the track terminal and the first differential input circuit.

In accordance with a preferred embodiment of the present invention, the peaking circuit further comprises a plurality of inductors, wherein each inductor is coupled to the control electrode of at least one transistor of one of the first and second differential input circuits.

In accordance with a preferred embodiment of the present invention, the peaking circuit further comprises a plurality of synthetic inductors, wherein each synthetic inductor is coupled to the control electrode of at least one transistor of one of the first and second differential input circuits.

In accordance with a preferred embodiment of the present invention, each synthetic inductor further comprises a peaking transistor; and an resistor/capacitor (RC) network that is coupled to the control electrode of the peaking transistor.

In accordance with a preferred embodiment of the present invention, a track-and-hold circuit is provided that is adapted to track an analog input signal and hold a sampled voltage of the analog input signal at a sampling instant for processing by other circuitry, in response to a track signal that alternates with a hold signal. The track-and-hold circuit comprises a bi-directional current source that sources and sinks current through a first output node and a second output node, wherein the bi-directional current source includes: a hold terminal that is adapted to provide the hold signal; a track terminal that is adapted to provide the track signal; a first bipolar junction transistor (BJT) that is coupled to the hold terminal at its base; a second BJT that is coupled to the hold terminal at its base; a third BJT that is coupled to the track terminal at its base; a fourth BJT that is coupled to the track terminal at its base; a fifth BJT that is coupled to the collector of the first BJT at its base; a sixth BJT that is coupled to the collector of the third BJT at its base and that is coupled to the emitter of the fifth BJT at its emitter; a seventh BJT that is coupled to the collector of the second BJT at its base; an eighth BJT that is coupled to the collector of the fourth BJT at its base and that is coupled to the emitter of the seventh BJT at its emitter; and a peaking circuit that is coupled to the bases of the fifth, sixth, seventh and eighth BJTs, wherein the peaking circuit causes the current through at least one of the transistors to exceed a threshold for a predetermined period when the track-and-hold circuit transitions from track to hold; a unity gain amplifier that is coupled to first and second output nodes of the bi-directional current source and that receives the analog input signal; a resistor coupled to an output of the unity gain amplifier; and a capacitor coupled between the resistor and ground.

In accordance with a preferred embodiment of the present invention, the peaking circuit further comprises a second capacitor that is coupled between the hold terminal and the base of the sixth BJT; and a third capacitor that is coupled between the track terminal and the base of the seventh BJT.

In accordance with a preferred embodiment of the present invention, the peaking circuit further comprises a fourth capacitor that is coupled between the hold terminal and the base of the eighth BJT; and a fifth capacitor that is coupled between the track terminal and the base of the fifth BJT.

In accordance with a preferred embodiment of the present invention, the peaking circuit further comprises a plurality of inductors, wherein each inductor is coupled at least one of the bases of fifth, sixth, seventh and eighth BJTs.

In accordance with a preferred embodiment of the present invention, the peaking circuit further comprises a plurality of synthetic inductors, wherein each synthetic inductor at least one of the bases of fifth, sixth, seventh and eighth BJTs.

In accordance with a preferred embodiment of the present invention, an apparatus is provided. The apparatus comprises an analog-to-digital converter (ADC) pipeline having a plurality of stages, wherein the ADC pipeline receives an analog input signal and outputs a digital signal across a plurality of channels, and wherein at least one stage includes a track-and-hold amplifier having a switched current source that includes: a bi-directional current source that sources and sinks current through a first output node and a second output node, wherein the bi-directional current source includes: a hold terminal that is adapted to provide the hold signal; a track terminal that is adapted to provide the track signal; a first bipolar junction transistor (BJT) that is coupled to the hold terminal at its base; a second BJT that is coupled to the hold terminal at its base; a third BJT that is coupled to the track terminal at its base; a fourth BJT that is coupled to the track terminal at its base; a fifth BJT that is coupled to the collector of the first BJT at its base; a sixth BJT that is coupled to the collector of the third BJT at its base and that is coupled to the emitter of the fifth BJT at its emitter; a seventh BJT that is coupled to the collector of the second BJT at its base; an eighth BJT that is coupled to the collector of the fourth BJT at its base and that is coupled to the emitter of the seventh BJT at its emitter; and a peaking circuit that is coupled to the bases of the fifth, sixth, seventh and eighth BJTs, wherein the peaking circuit causes the current through at least one of the transistors to exceed a threshold for a predetermined period when the track-and-hold circuit transitions from track to hold; a unity gain amplifier that is coupled to first and second output nodes of the bi-directional current source and that receives the analog input signal; a resistor coupled to an output of the unity gain amplifier; and a capacitor coupled between the resistor and ground; and an ADC driver that is coupled to the ADC pipeline.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
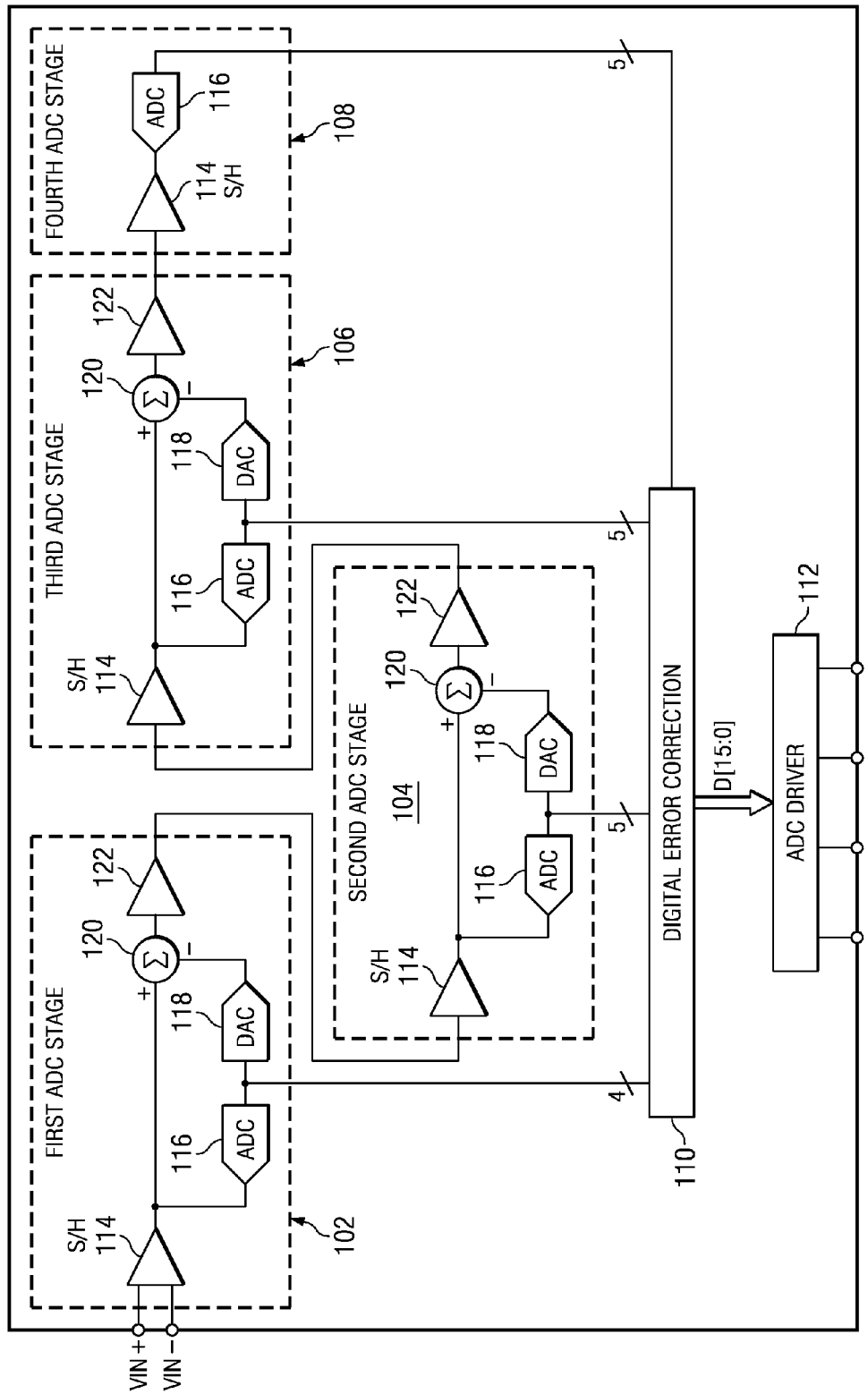
FIG. 1 is block diagram depicting an analog-to-digital converter (ADC) in accordance with a preferred embodiment of the present invention.

Refer now to the drawings wherein depicted elements are, for the sake of clarity, not necessarily shown to scale and wherein like or similar elements are designated by the same reference numeral through the several views.

Referring to FIG. 1 of the drawings, the reference numeral 100 generally designates an ADC in accordance with a preferred embodiment of the present invention. The ADC 100 generally comprises an ADC pipeline, digital error correction circuitry 110, and an ADC driver 112. The ADC pipeline is generally divided into a number of stages. Here, for example, four stages 102, 104, 106, and 108 are employed. As shown in FIG. 1, stages 102 through 106 are initial stages and each includes a sample-and-hold or track-and-hold (S/H) amplifier 114, ADC 116, digital-to-analog converter (DAC) 118, summing element 120, and amplifier 122. Stage 108 is, for example, an output or final stage that includes an S/H amplifier 114 and an ADC 116.

In operation, the ADC 100 receives an analog input signal though input nodes or pins VIN+ and VIN− and outputs a digital signal across several channels (for example 16 channels). Each of stages 102 through 106 is coupled in series with one another, receiving an analog signal and outputting an analog signal. These stages 102 through 106 communicate with the digital error correction circuitry 110 so as to perform error correction. Stage 108 receives an analog signal from stage 106 and outputs a digital signal across several channels, using digital error correction circuitry 110 to perform error correction. The ADC driver 112 receives the digital signal from the digital error correction circuitry and outputs the digital signal through a plurality of nodes or pins.

Figure 2A:
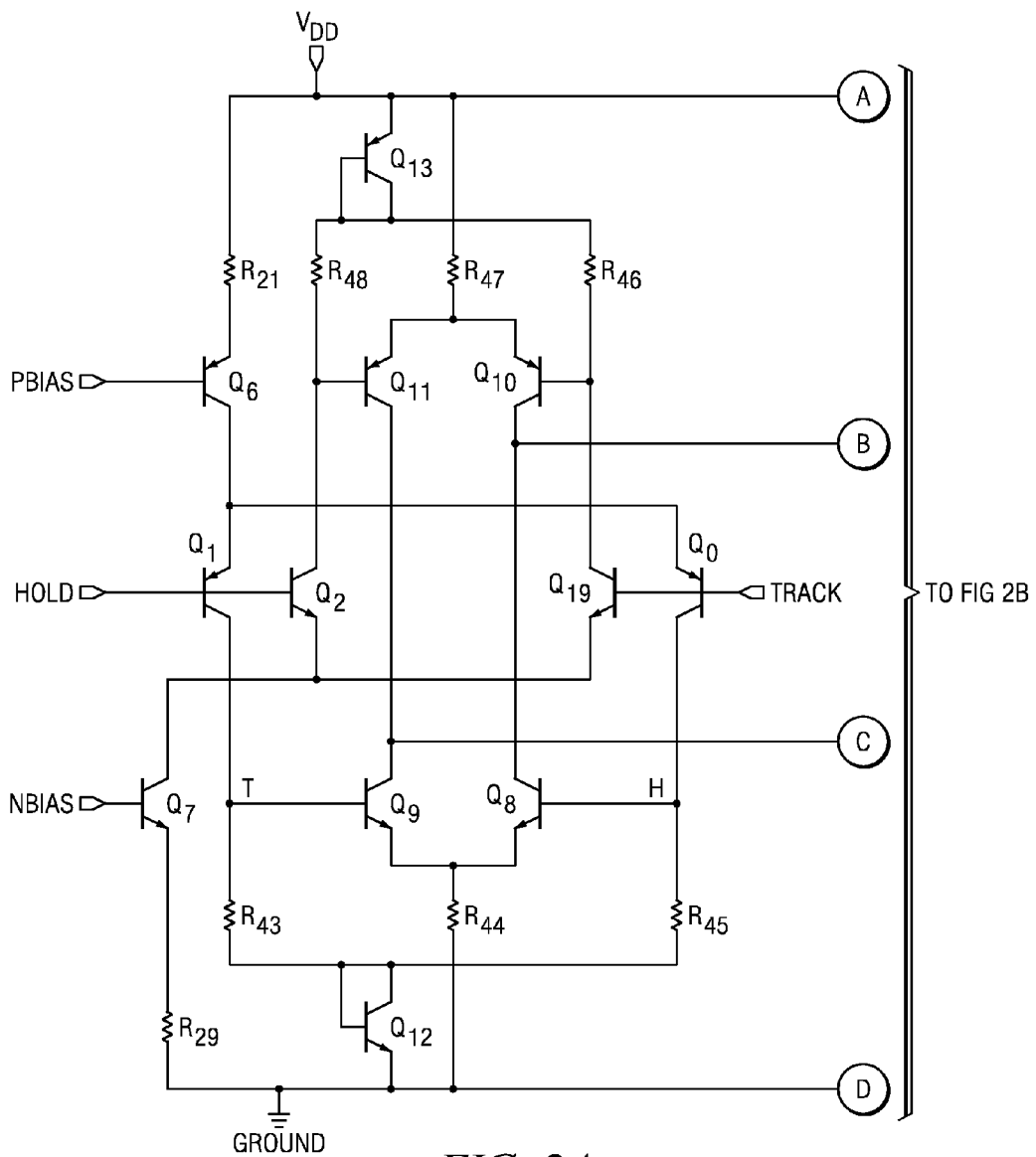
FIGS. 2A to 2B are circuit diagrams depicting a conventional sample-and-hold circuit.
Figure 2B:
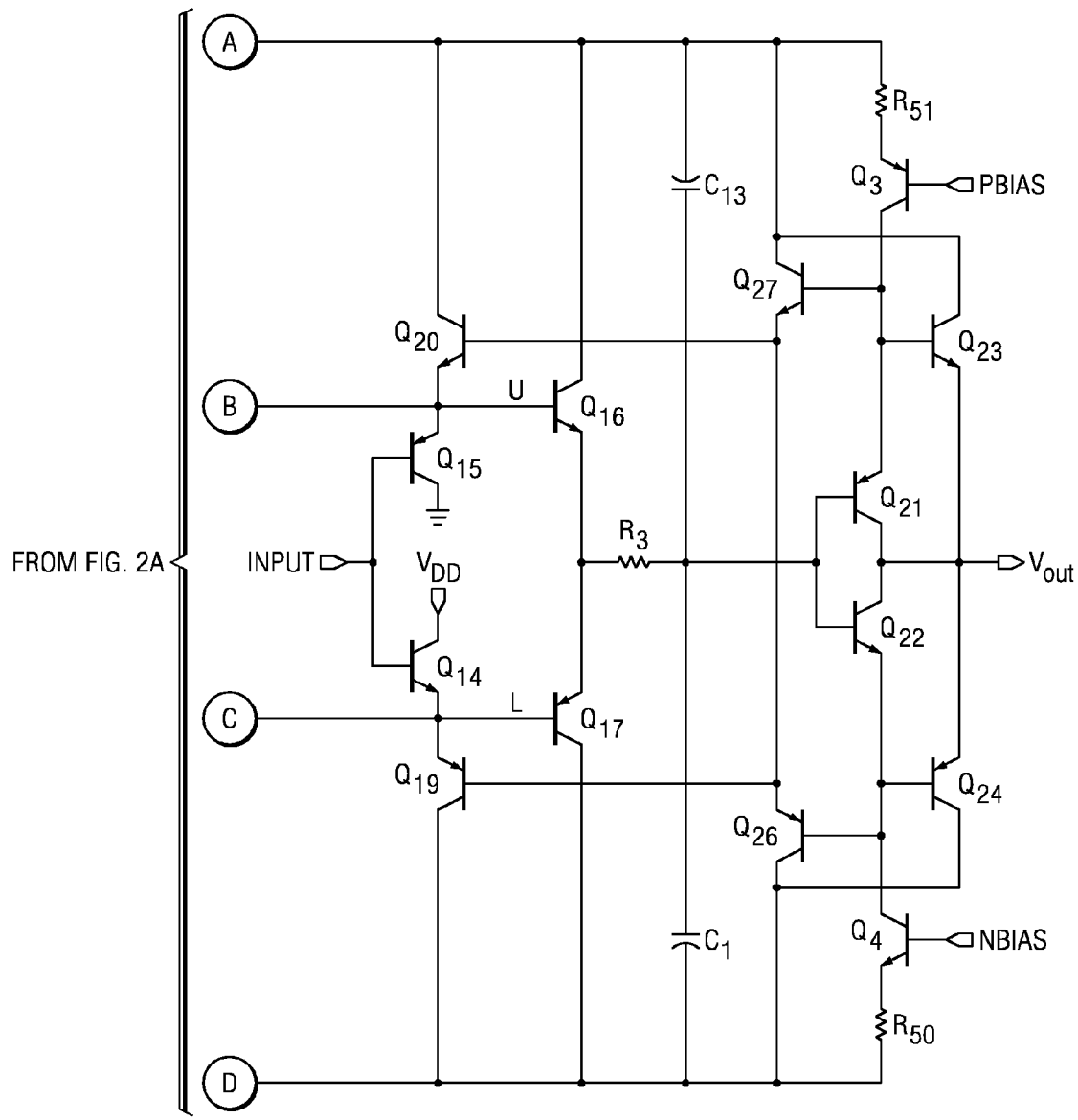

FIGS. 2A and 2B show a circuit diagram of an exemplary prior art sample-and-hold circuit that can be used as S/H amplifier 114. The circuit is powered by a power supply providing a source voltage VDD at a VDD node, and a current return ground at a GROUND node. Referring to FIG. 2A, a PNP bipolar transistor Q6 has its emitter connected to VDD through a resistor R21, receiving a bias voltage from node PBIAS at its base. The collector of transistor Q6 is connected to the emitter of a PNP bipolar transistor Q1 and to the emitter of a PNP bipolar transistor Q0. A diode-connected PNP bipolar transistor Q13 has its emitter connected to VDD, and its base and collector connected to one terminal of a resistor R46 and to one terminal of a resistor R48. The other end of resistor R48 is connected to the base of a PNP bipolar transistor Q11 and to the collector of an NPN bipolar transistor Q2. The other end of resistor R46 is connected to the base of a PNP bipolar transistor Q10 and to the collector of an NPN bipolar transistor Q19. The emitters of transistors Q10 and Q11 are connected to VDD through a resistor R47. The collector of transistor Q11 is connected to the collector of an NPN bipolar transistor Q9, and to a connection identified as "C" to the circuitry shown in FIG. 2B. The collector of transistor Q10 is connected to the collector of an NPN bipolar transistor Q8, and to a connection identified as "B" to the circuitry shown in FIG. 2B.

An NPN bipolar transistor Q7 has its emitter connected to GROUND through a resistor R29, receiving a bias voltage from node NBIAS at its base. The collector of transistor Q7 is connected to the emitter of transistor Q2 and to the emitter of transistor Q19. A diode-connected NPN bipolar transistor Q12 has its emitter connected to GROUND, and its base and collector connected to one terminal of a resistor R43 and to one terminal of a resistor R45. The other end of resistor R43 is connected to the base of transistor Q9 and to the collector of transistor Q1. The other end of resistor R45 is connected to the base of transistor Q8 and to the collector of transistor Q0. The emitters of transistors Q8 and Q9 are connected to GROUND through a resistor R44. The base of transistor Q1 and the base of transistor Q2 are connected together and to a HOLD node receiving a HOLD signal. The base of transistor Q0 and the base of transistor Q19 are connected together and to a TRACK node receiving a TRACK signal. The power supply node VDD connects to the circuitry of FIG. 2B by way of a connection identified as "A", while the GROUND node connects to the circuitry of FIG. 2B by way of a connection identified as "D".

Referring to FIG. 2B, the collector of an NPN bipolar transistor Q20 is connected to VDD, as is the collector of an NPN bipolar transistor Q16. The emitter of transistor Q20 is connected to the emitter of a PNP bipolar transistor Q15, which has its collector connected to GROUND. The collector of a PNP bipolar transistor Q19 is connected to GROUND, as is the collector of a PNP bipolar transistor Q17. The emitter of transistor Q19 is connected to the emitter of an NPN bipolar transistor Q14, which has its collector connected to VDD. The base of transistor Q14 and the base of transistor Q15 are both connected together and to an INPUT node to which an INPUT signal is applied, which is an analog input signal to be digitized.

The base of transistor Q16 is connected to receive connection "B" from the circuitry of FIG. 2A, while the base of transistor Q17 is connected to receive connection "C" from the circuitry of FIG. 2A. The emitters of transistors Q16 and Q17 are connected together and to a terminal of a resistor R3. The other terminal of resistor R3 is connected to the common connection node of terminals of a capacitor C1 and a capacitor C13. The other terminal of capacitor C1 is connected to GROUND, while the other terminal of capacitor C13 is connected to VDD. The common connection node of resistor R3 and capacitors C1 and C13 is connected to the common connection node of the base of a PNP bipolar transistor Q21 and the base of an NPN bipolar transistor Q22. The emitter of transistor Q21 is connected to the base of an NPN bipolar transistor Q27 and to the base of an NPN bipolar transistor Q23, and to the collector of a PNP transistor Q3. The base of transistor Q3 is connected to PBIAS, while its emitter is connected to VDD through a resistor R51. The emitter of transistor Q27 is connected to the base of transistor Q20, to the base of transistor Q19 and to the emitter of a PNP transistor Q26. The collector of transistor Q27 is connected to VDD and to the collector of transistor Q23. The emitter of transistor Q22 is connected to the base of a PNP bipolar transistor Q26 and to the base of a PNP bipolar transistor Q24, and to the collector of an NPN transistor Q4. The base of transistor Q4 is connected to NBIAS, while its emitter is connected to VDD through a resistor R50. The collector of transistor Q26 is connected to GROUND and to the collector of transistor Q24. The emitters of transistors Q23 and Q24 are connected together and to the collectors of transistors Q21 and Q22, the common connection of all of which forming the output node VOUT.

Referring now back to FIG. 2A, in operation, transistor Q6, which is set using the value of PBIAS, functions as a current source, and gets switched to either resistor R43 or resistor R45, depending on the state of signals TRACK and HOLD. Transistor Q7, which is set using the value of NBIAS, functions as a current sink, operating in complementary operation to the current sourcing of transistor Q6. Transistors Q8, Q9, Q10 and Q11 operate in cooperation with transistors Q6 and Q7 to establish a simultaneous current source through connection "B" and current sink through connection "C", or, alternatively, a simultaneous current source through connection "C" and current sink through connection "B".

Thus, during the tracking phase, when the signal TRACK is high, turning transistor Q0 off and transistor Q1 on, the current from transistor Q6 is switched to resistor R43, thus establishing a voltage at node T. This voltage sets up a corresponding current sinking through transistor Q9, and thus through connection "C", while at the same time a current sourcing is set up though transistor Q10, and thus through connection "B", since the high TRACK signal turns on transistor Q19, and, consequently, also turns on transistor Q10.

During the holding phase, when the signal HOLD is high, the reverse occurs. That is, the high HOLD signal turns transistor Q1 off and transistor Q0 on, switching the current from transistor Q6 to resistor R45, thus establishing a voltage at node H. This voltage sets up a corresponding current sinking through transistor Q8, and thus through connection "B", while at the same time a current sourcing is set up though transistor Q11, and thus through connection "C", since the high HOLD signal turns on transistor Q2, and, consequently, also turns on transistor Q11. In general, the circuitry shown in FIG. 2A functions as a current switch, switching current sinking and sourcing between connections "B" and "C" in response to the state of the TRACK and HOLD signals. Also in general, a typical track-and-hold circuit will have some circuitry that has a switching function, in response to the state of the TRACK and HOLD signals, for the signal holding circuitry, which in this embodiment is shown in FIG. 2B.

Referring now back to FIG. 2B, and continuing to describe the operation of the circuit of FIGS. 2A and 2B, during the tracking phase current is sourced on connection "B" and sunk on connection "C", thus turning on transistors Q16 and Q17. Now, transistors Q14, Q15, Q16 and Q17, together form a unity gain amplifier, with the current sourced/sunk via connections "B" and "C", transistors Q19 and Q20 are off. During this tracking phase, the analog INPUT signal is basically buffered in the unity gain amplifier and, since transistors Q16 and Q17 are on, the buffered voltage is transferred to the plates of capacitors C1 and C13 through resistor R3.

During the holding phase current is sourced on connection "C" and sunk on connection "B", thus turning off the unity gain amplifier, as well as transistors Q16 and Q17. These currents flow through transistors Q20 and Q19. Q19 and Q20 act to limit the voltage on the nodes U and L in such a way that the resulting reverse bias of Q16s and Q17s base emitter junction is independent of the incoming signal at the "Input". This helps to preserve the voltage across capacitors C1 and C13 at the time of transition from tracking phase to holding phase. This voltage is buffered in a unity gain output amplifier formed by transistors Q21, Q22, Q23 Q24, Q26 and Q27, and resistors R50 and R51, and provided as an output voltage VOUT to the output node VOUT.

A problem with the sample-and-hold circuit of FIGS. 2A and 2B is that, when transitioning from track to hold, the distortion of the resulting captured signal is in part dependent on the frequency of the signal being sampled as well as the time to transition from track to hold. This time is dependent on the magnitude of the current available to perform the switching. To obviate this problem, the sample-and-hold circuits of FIGS. 3A to 5B employ peaking circuits that makes available a large current (being used during the transition) and make available a much smaller current when the sample-and-hold circuits of FIGS. 3A to 5B are tracking.

Figure 3A:
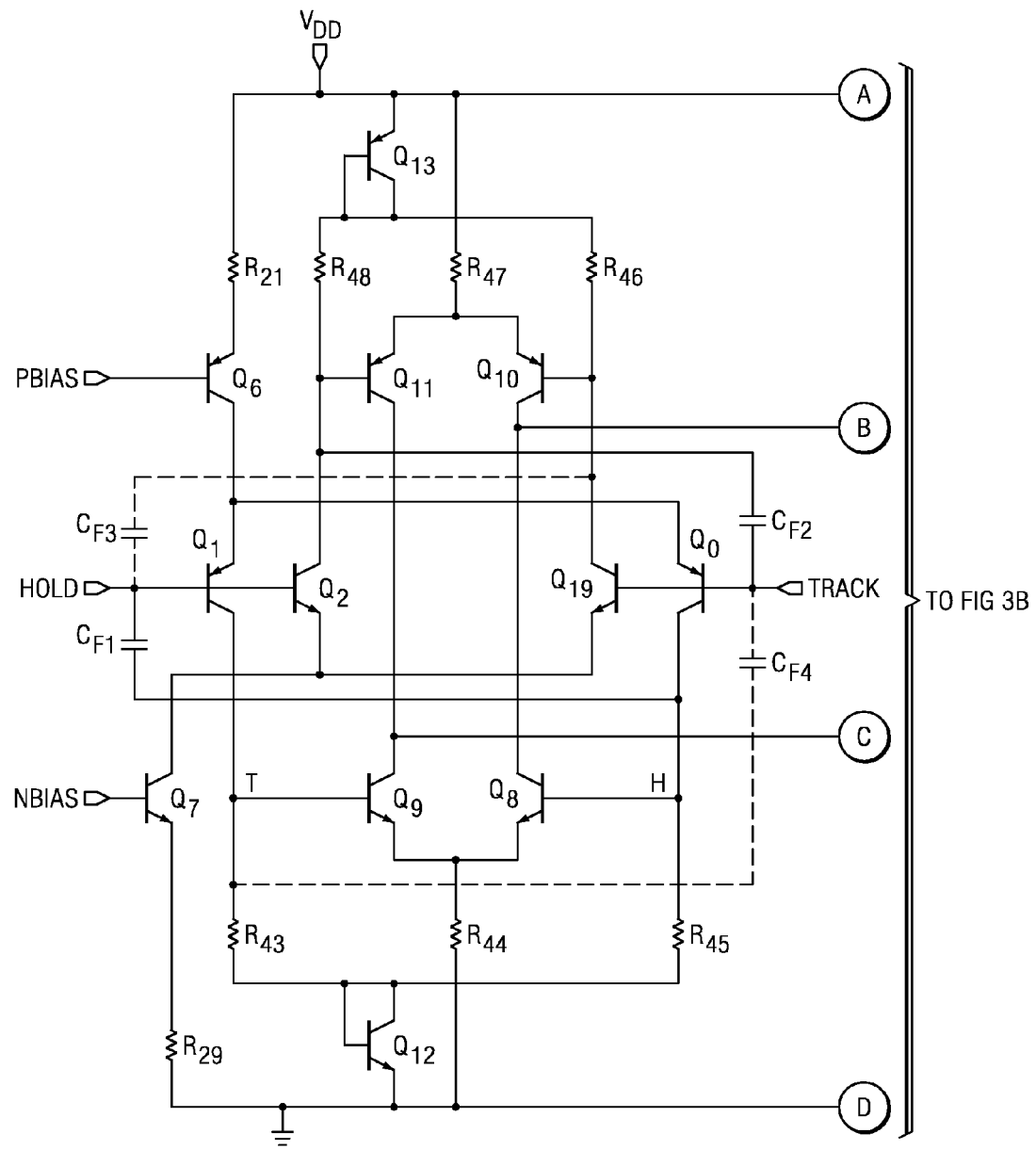
FIGS. 3A and 3B are circuit diagrams depicting a sample-and-hold circuit that employs feed-forward capacitors as a peaking circuit in accordance with a preferred embodiment of the present invention.
Figure 3B:
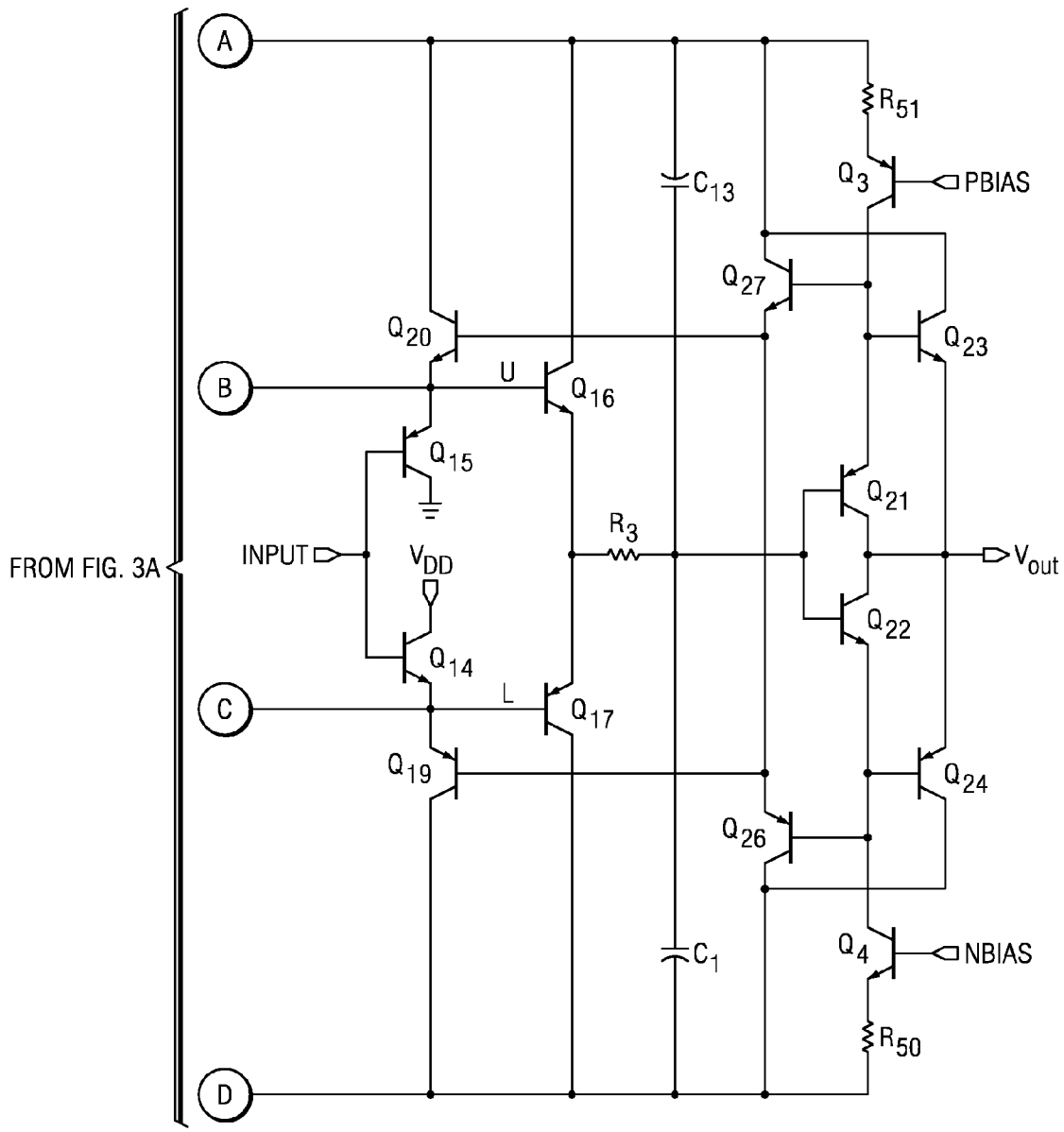

Turning first to FIGS. 3A and 3B, a feed-forward capacitor arrangement is shown as the peaking circuit. Preferably, capacitor CF1 is coupled between the hold terminal and the base of transistor Q8, while capacitor CF2 is coupled between the track terminal and the base of transistor Q1. Optionally, capacitor CF3 can also be coupled between hold terminal and the base of transistor Q10, and capacitor CF4 can be coupled between the track terminal and the base of transistor Q9. Each of capacitors CF1 through CF4 preferably has a value of about 10 pF, and generally operates to feed-forward its track signal TRACK or hold signal HOLD to its respective transistor Q8 through Q11. Additionally, the feed-forward capacitors CF1 to CF4 should preferably be employed when the amplitude of the track signal TRACK or hold signal HOLD is greater than the amplitude of the signals at the bases of transistors Q8 through Q11.

Figure 4A:
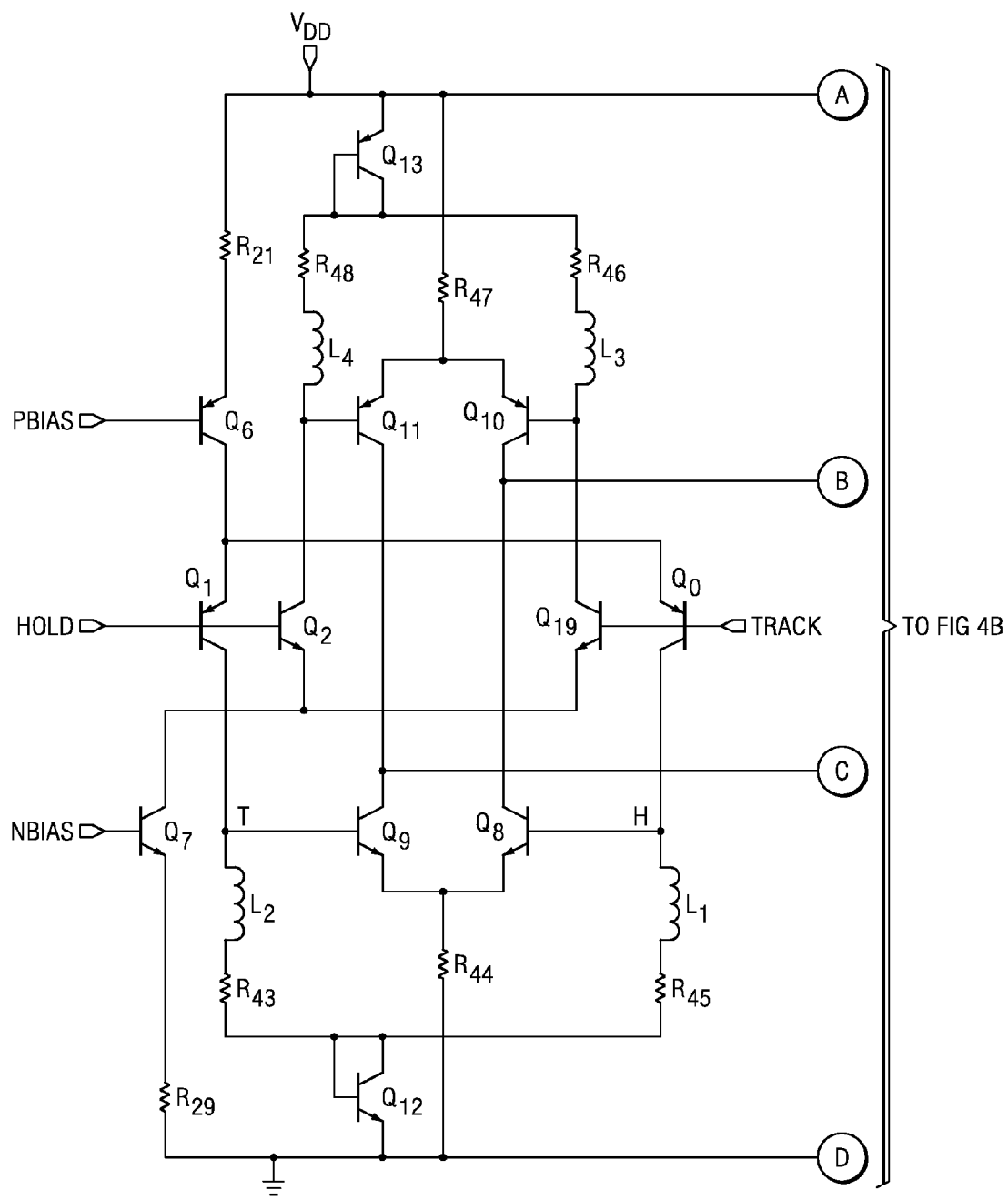
FIGS. 4A and 4B are circuit diagrams depicting a sample-and-hold circuit that employs inductors as a peaking circuit in accordance with a preferred embodiment of the present invention.
Figure 4B:
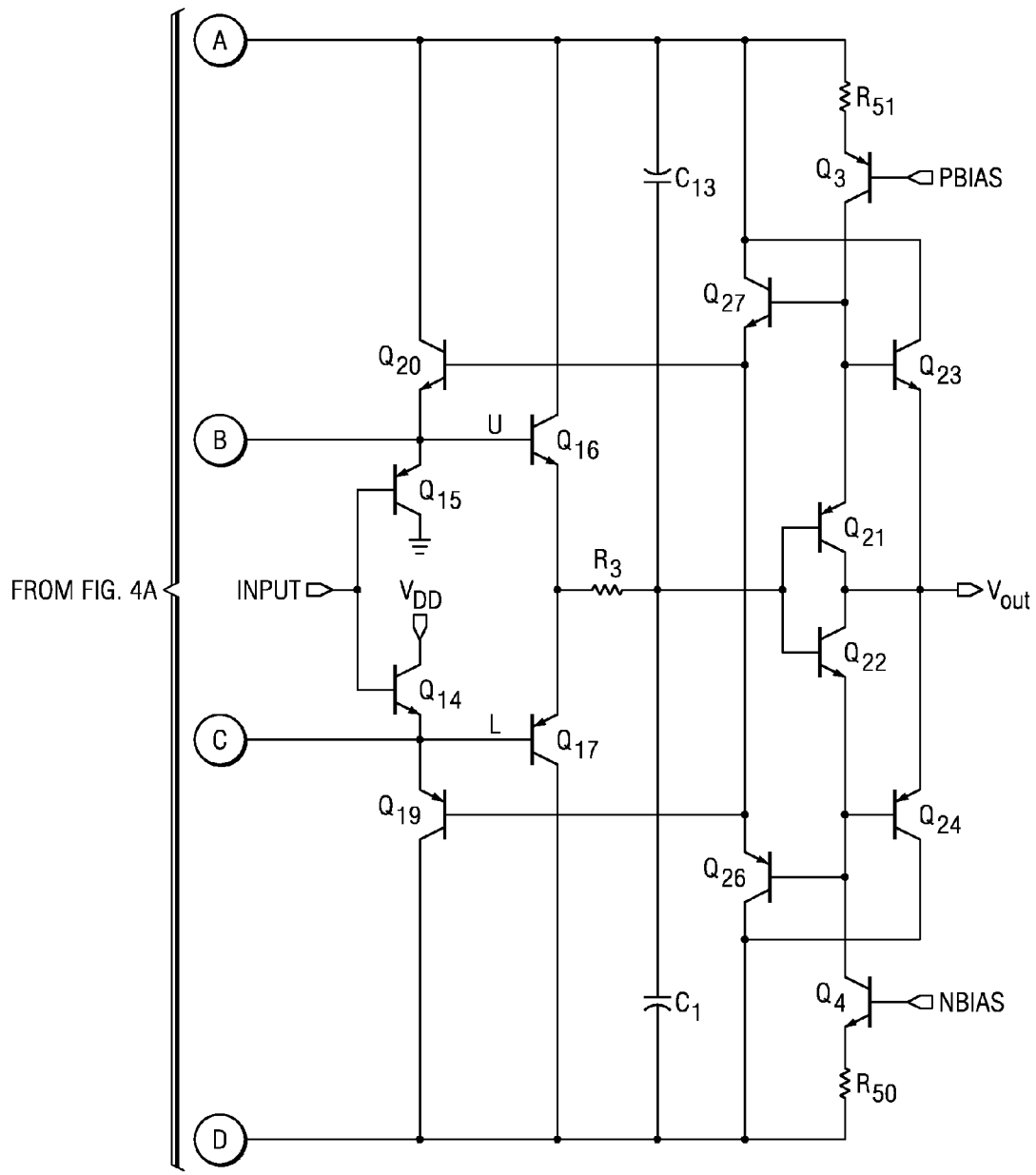

Alternatively, as shown in FIGS. 4A and 4B, inductors L1 through L4 can be employed as the peaking circuit. These inductors L1 through L4 (which preferably have inductances of about 1 nH) are coupled between the bases of transistors Q8 through Q12 (respectively) and a voltage rail (VDD or ground). These inductors L1 through L4 provide a high impedance for a high frequency signal, allowing for a peaking current through transistors Q8 through Q11.

Figure 5A:
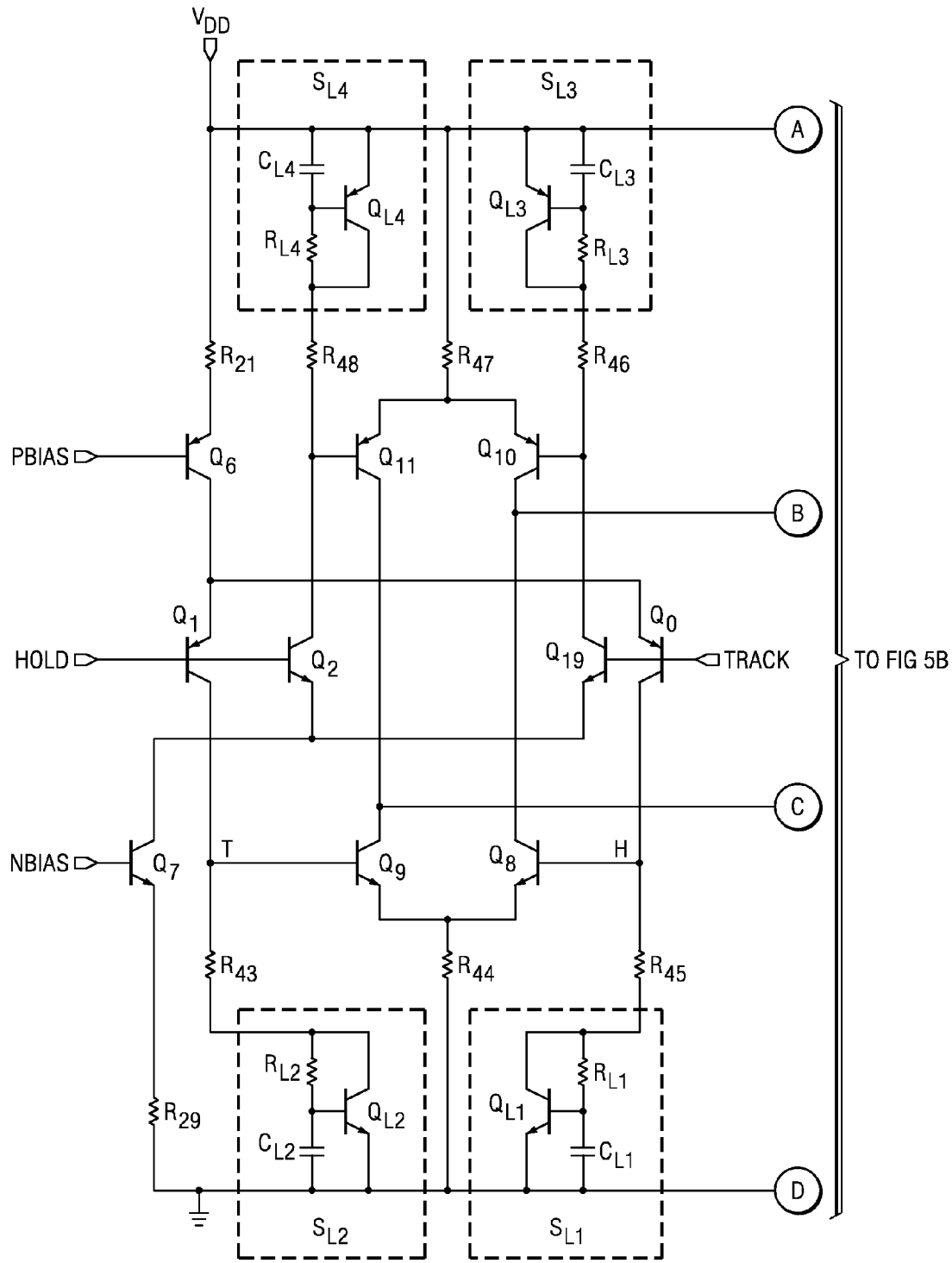
FIGS. 5A and 5B are circuit diagrams depicting a sample-and-hold circuit that employs synthetic inductors as a peaking circuit in accordance with a preferred embodiment of the present invention.
Figure 5B:
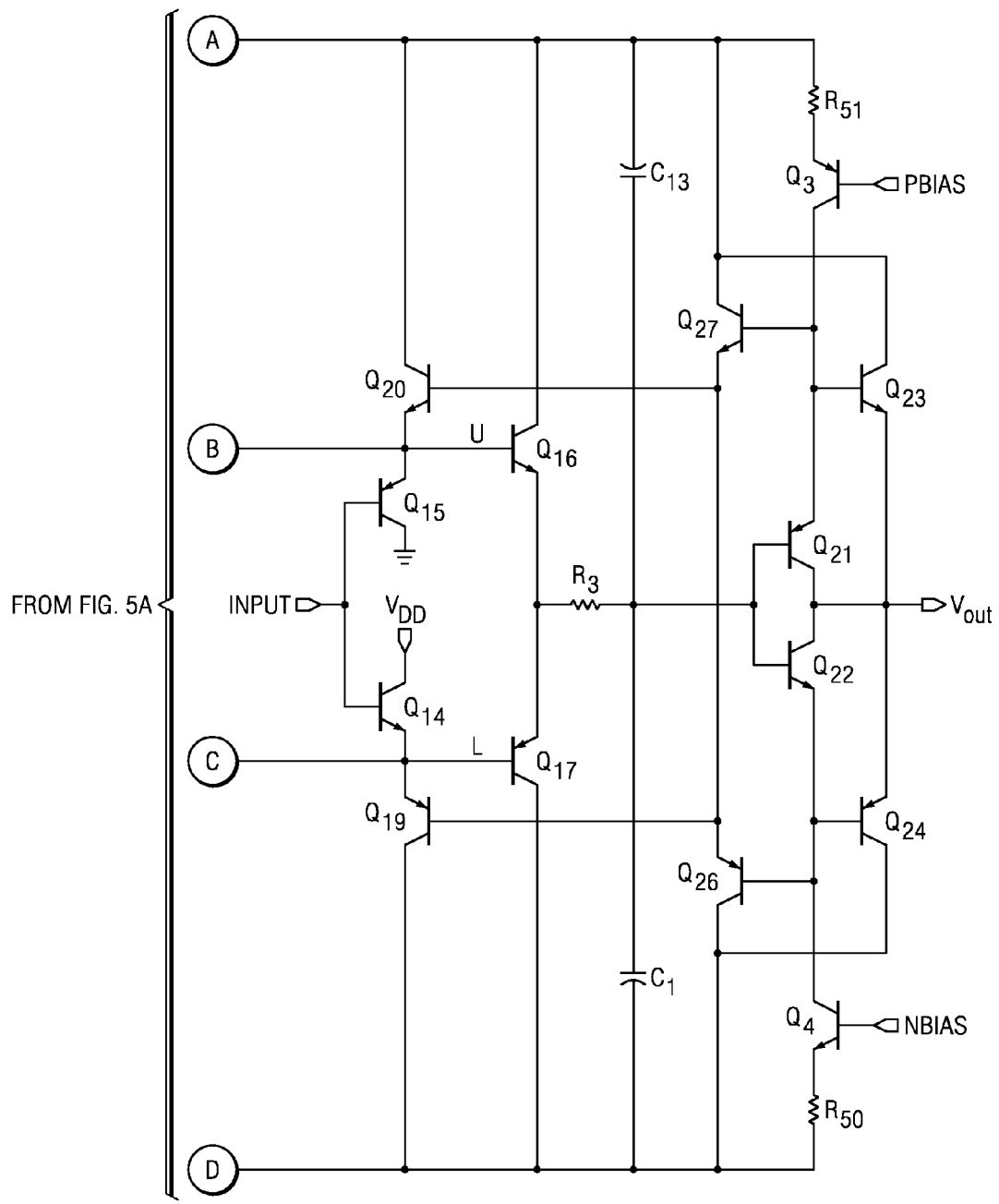

As another alternative, as shown in FIGS. 5A and 5B, synthetic inductors SL1 through SL4 can be employed as the peaking circuit. These synthetic inductors SL1 through SL4 are generally comprised of a peaking transistor QL1 through QL4 coupled between the bases of transistors Q8 through Q11 (respectively) and a voltage rail (VDD or ground). Additionally, a resistor/capacitor (RC) network coupled to bases of each of peaking transistors QL1 through QL4. The RC networks are generally comprised of a peaking resistor RL1 through RL4 and a peaking capacitor CL1 through CL4. The resistors RL1 through RL4 preferably have a resistance of about 1 kΩ and the capacitors preferably have a capacitance of about 1 pF. These selected capacitances and resistances combined with the peaking transistors QL1 through QL4 generally mimic inductors having inductance of about 1 nH are coupled between the bases of transistors Q8 through Q12 (respectively) and a voltage rail (VDD or ground), similar to peaking inductors L1 through L4. These synthetic inductors SL1 through SL4 provide also a high impedance for a high frequency signal, allowing for a peaking current.

Figure 6:
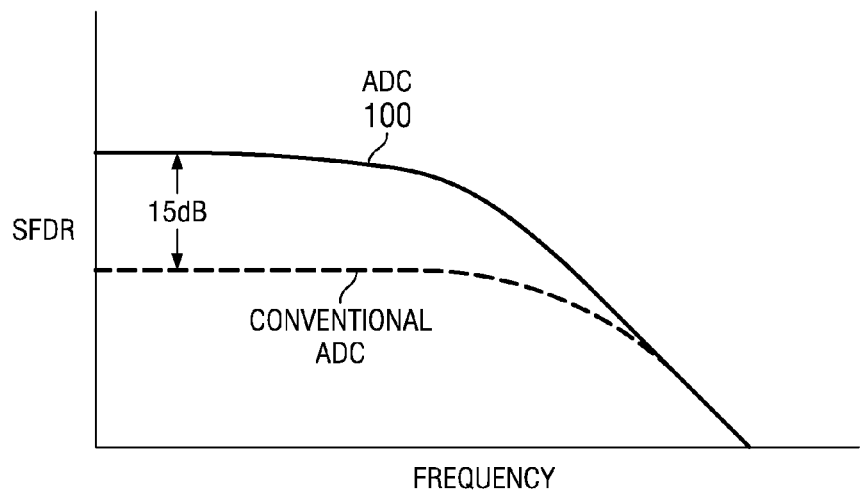
FIG. 6 is a graph depicting the Spurious-Free Dynamic Range (SFDR) versus frequency for a convention ADC and the ADC of FIG. 1, which employs at least one of the sample-and-hold circuits of FIGS. 3A to 5B.
Figure 7:
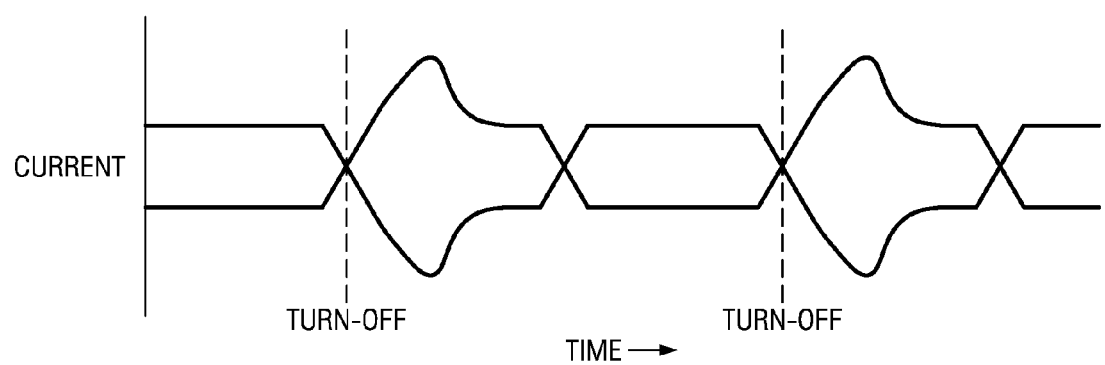
FIG. 7 depicts a timing diagram that shows the peaking current of the sample-and-hold circuits of FIGS. 3A to 5B.

Turning to FIG. 6, a graph depicting the Spurious-Free Dynamic Range (SFDR) versus frequency for a conventional ADC and an ADC 100 is shown. As can be observed, there is a 15 dB gain in the SFDR with the use of a peaking circuit at low frequencies. Additionally, FIG. 7 depicts a timing diagram showing the peaking current when the sample-and-hold circuits of FIGS. 3A to 5B transition from track to hold.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. A track-and-hold circuit that is adapted to track an analog input signal and hold a sampled voltage of the analog input signal at a sampling instant for processing by other circuitry, in response to a track signal that alternates with a hold signal, the track-and-hold circuit comprising:
    a bi-directional current source that sources and sinks current through a first output node and a second output node, wherein the bi-directional current source includes:
    a hold terminal that is adapted to provide the hold signal;
    a track terminal that is adapted to provide the track signal;
    a first differential input circuit having a plurality of transistors, wherein the first differential input circuit is adapted to receive the track signal and the hold signal and is coupled to the first and second output nodes;
    a second differential input circuit having a plurality of transistors, wherein the differential input circuit is adapted to receive the track signal and the hold signal and is coupled to the first and second output nodes; and
    a peaking circuit that is coupled to the first and second differential input circuits, wherein the peaking circuit causes the current through at least one of the transistors to exceed a threshold for a predetermined period when the track-and-hold circuit transitions from track to hold;
    a unity gain amplifier that is coupled to first and second output nodes of the bi-directional current source and that receives the analog input signal;
    a resistor coupled to an output of the unity gain amplifier; and
    a capacitor coupled between the resistor and ground.

2. The apparatus of claim 1, wherein the peaking circuit further comprises:
    a second capacitor that is coupled between the hold terminal and the first differential input circuit; and
    a third capacitor that is coupled between the track terminal and the second differential input circuit.

3. The apparatus of claim 2, wherein the peaking circuit further comprises:
    a fourth capacitor that is coupled between the hold terminal and the second differential input circuit; and
    a fifth capacitor that is coupled between the track terminal and the first differential input circuit.

4. The apparatus of claim 1, wherein the peaking circuit further comprises a plurality of inductors, wherein each inductor is coupled to the control electrode of at least one transistor of one of the first and second differential input circuits.

5. The apparatus of claim 1, wherein the peaking circuit further comprises a plurality of synthetic inductors, wherein each synthetic inductor is coupled to the control electrode of at least one transistor of one of the first and second differential input circuits.

6. The apparatus of claim 5, wherein each synthetic inductor further comprises:
    a peaking transistor; and
    a resistor/capacitor (RC) network that is coupled to the control electrode of the peaking transistor.

7. A track-and-hold circuit that is adapted to track an analog input signal and hold a sampled voltage of the analog input signal at a sampling instant for processing by other circuitry, in response to a track signal that alternates with a hold signal, the track-and-hold circuit comprising:

a bi-directional current source that sources and sinks current through a first output node and a second output node, wherein the bi-directional current source includes:

a hold terminal that is adapted to provide the hold signal;

a track terminal that is adapted to provide the track signal;

a first bipolar junction transistor (BJT) that is coupled to the hold terminal at its base;

a second BJT that is coupled to the hold terminal at its base;

a third BJT that is coupled to the track terminal at its base;

a fourth BJT that is coupled to the track terminal at its base;

a fifth BJT that is coupled to the collector of the first BJT at its base;

a sixth BJT that is coupled to the collector of the third BJT at its base and that is coupled to the emitter of the fifth BJT at its emitter;

a seventh BJT that is coupled to the collector of the second BJT at its base;

an eighth BJT that is coupled to the collector of the fourth BJT at its base and that is coupled to the emitter of the seventh BJT at its emitter; and a peaking circuit that is coupled to the bases of the fifth, sixth, seventh and eighth BJTs, wherein the peaking circuit causes the current through at least one of the transistors to exceed a threshold for a predetermined period when the track-and-hold circuit transitions from track to hold;

a unity gain amplifier that is coupled to first and second output nodes of the bi-directional current source and that receives the analog input signal;

a resistor coupled to an output of the unity gain amplifier; and a capacitor coupled between the resistor and ground.

8. The apparatus of claim 7, wherein the peaking circuit further comprises:

a second capacitor that is coupled between the hold terminal and the base of the sixth BJT; and a third capacitor that is coupled between the track terminal and the base of the seventh BJT.

9. The apparatus of claim 8, wherein the peaking circuit further comprises:

a fourth capacitor that is coupled between the hold terminal and the base of the eighth BJT; and a fifth capacitor that is coupled between the track terminal and the base of the fifth BJT.

10. The apparatus of claim 7, wherein the peaking circuit further comprises a plurality of inductors, wherein each inductor is coupled at least one of the bases of fifth, sixth, seventh and eighth BJTs.

11. The apparatus of claim 7, wherein the peaking circuit further comprises a plurality of synthetic inductors, wherein each synthetic inductor at least one of the bases of fifth, sixth, seventh and eighth BJTs.

12. The apparatus of claim 11, wherein each synthetic inductor further comprises:

a peaking transistor; and an RC network that is coupled to the control electrode of the peaking transistor.

13. An apparatus comprising:

an analog-to-digital converter (ADC) pipeline having a plurality of stages, wherein the ADC pipeline receives an analog input signal and outputs a digital signal across a plurality of channels, and wherein at least one stage includes a track-and-hold amplifier having a switched current source that includes:

a bi-directional current source that sources and sinks current through a first output node and a second output node, wherein the bi-directional current source includes:

a hold terminal that is adapted to provide the hold signal;

a track terminal that is adapted to provide the track signal;

a first bipolar junction transistor (BJT) that is coupled to the hold terminal at its base;

a second BJT that is coupled to the hold terminal at its base;

a third BJT that is coupled to the track terminal at its base;

a fourth BJT that is coupled to the track terminal at its base;

a fifth BJT that is coupled to the collector of the first BJT at its base;

a sixth BJT that is coupled to the collector of the third BJT at its base and that is coupled to the emitter of the fifth BJT at its emitter;

a seventh BJT that is coupled to the collector of the second BJT at its base;

an eighth BJT that is coupled to the collector of the fourth BJT at its base and that is coupled to the emitter of the seventh BJT at its emitter; and a peaking circuit that is coupled to the bases of the fifth, sixth, seventh and eighth BJTs, wherein the peaking circuit causes the current through at least one of the transistors to exceed a threshold for a predetermined period when the track-and-hold circuit transitions from track to hold;

a unity gain amplifier that is coupled to first and second output nodes of the bi-directional current source and that receives the analog input signal;

a resistor coupled to an output of the unity gain amplifier; and a capacitor coupled between the resistor and ground; and an ADC driver that is coupled to the ADC pipeline.

14. The apparatus of claim 13, wherein the peaking circuit further comprises:

a second capacitor that is coupled between the hold terminal and the base of the sixth BJT; and a third capacitor that is coupled between the track terminal and the base of the seventh BJT.

15. The apparatus of claim 14, wherein the peaking circuit further comprises:

a fourth capacitor that is coupled between the hold terminal and the base of the eighth BJT; and a fifth capacitor that is coupled between the track terminal and the base of the fifth BJT.

16. The apparatus of claim 13, wherein the peaking circuit further comprises a plurality of inductors, wherein each inductor is coupled at least one of the bases of fifth, sixth, seventh and eighth BJTs.

17. The apparatus of claim 13, wherein the peaking circuit further comprises a plurality of synthetic inductors, wherein each synthetic inductor at least one of the bases of fifth, sixth, seventh and eighth BJTs.

18. The apparatus of claim 17, wherein each synthetic inductor further comprises:

a peaking transistor; and an RC network that is coupled to the control electrode of the peaking transistor.

* * * * *